United States Patent [19]

Nishimura

[11] Patent Number: 5,294,262
[45] Date of Patent: Mar. 15, 1994

[54] METHOD OF CLEANING A PROCESS TUBE WITH CLF₃ GAS AND CONTROLLING THE TEMPERATURE OF PROCESS

[75] Inventor: Toshiharu Nishimura, Kofu, Japan

[73] Assignee: Tokyo Electron Limited, Tokyo, Japan

[21] Appl. No.: 80,588

[22] Filed: Jun. 24, 1993

Related U.S. Application Data

[63] Continuation of Ser. No. 818,677, Jan. 9, 1992, abandoned.

[30] Foreign Application Priority Data

Jan. 31, 1991 [JP] Japan .................................. 3-031852

[51] Int. Cl.⁵ .................................................. B08B 9/00
[52] U.S. Cl. ........................................ 134/22.1; 134/31; 134/37; 134/42; 156/643; 156/646
[58] Field of Search ................. 134/22.1, 22.13, 22.17, 134/30, 31, 37, 42; 156/643, 646

[56] References Cited

U.S. PATENT DOCUMENTS

| | | | |
|---|---|---|---|
| 4,310,380 | 1/1982 | Flamm et al. | 156/643 |
| 4,568,410 | 2/1986 | Thornquist | 156/643 |
| 5,022,961 | 6/1991 | Izumi et al. | 156/646 |

*Primary Examiner*—R. Bruce Breneman
*Assistant Examiner*—Saeed T. Chaudhry
*Attorney, Agent, or Firm*—Oblon, Spivak, McClelland, Maier & Neustadt

[57] ABSTRACT

A method of cleaning a process tube and a wafer boat, comprising the steps of, carrying wafers out of the process tube, controlling the temperature in the process tube saw as or lower than a process temperature and higher than a boiling point of ClF₃, said process temperature being kept in the process tube when the process of forming film on the wafers is carried out in the process tube, and supplying ClF₃-contained cleaning gas into the process tube to react the cleaning gas with the film of the silicon oxide adhering to the inner wall of the process tube and the wafer boat.

19 Claims, 6 Drawing Sheets

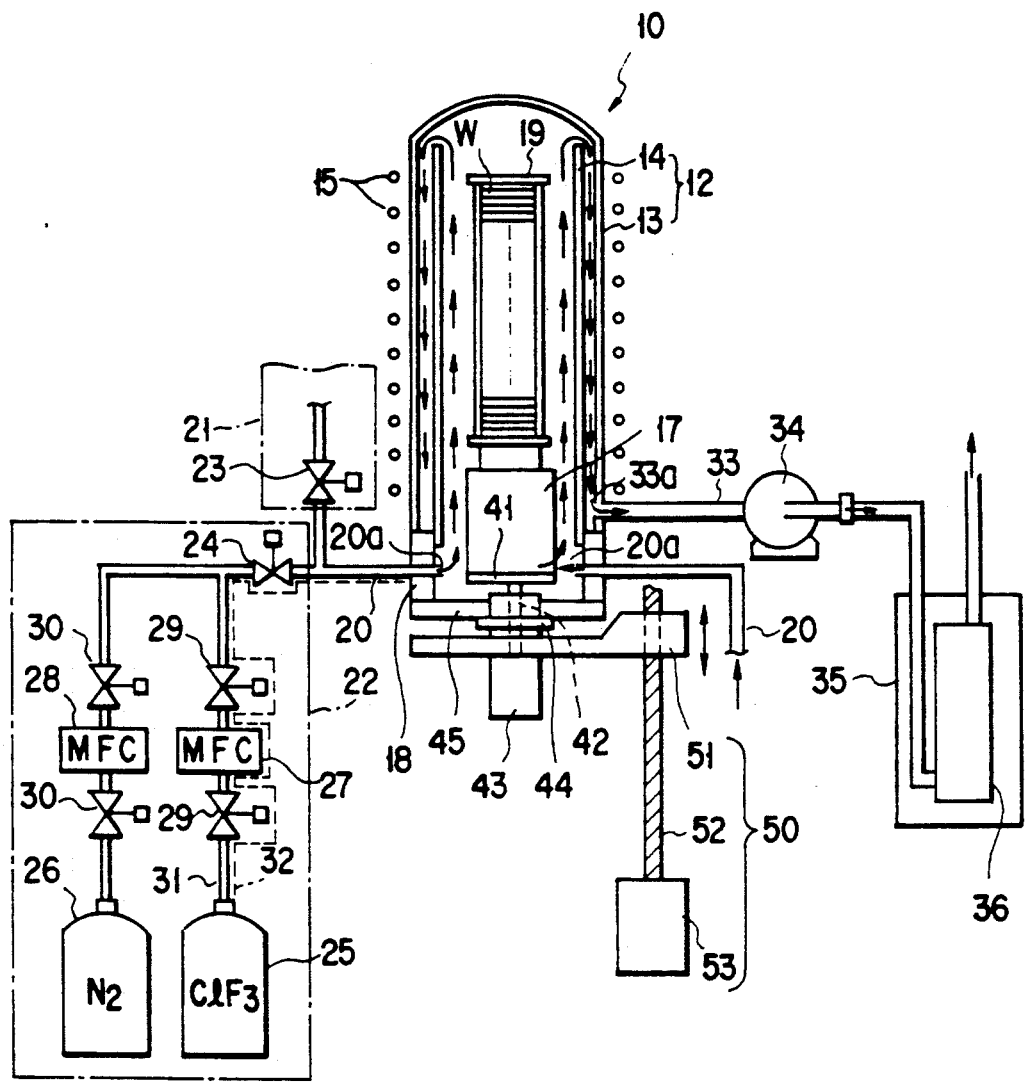
F I G. 1

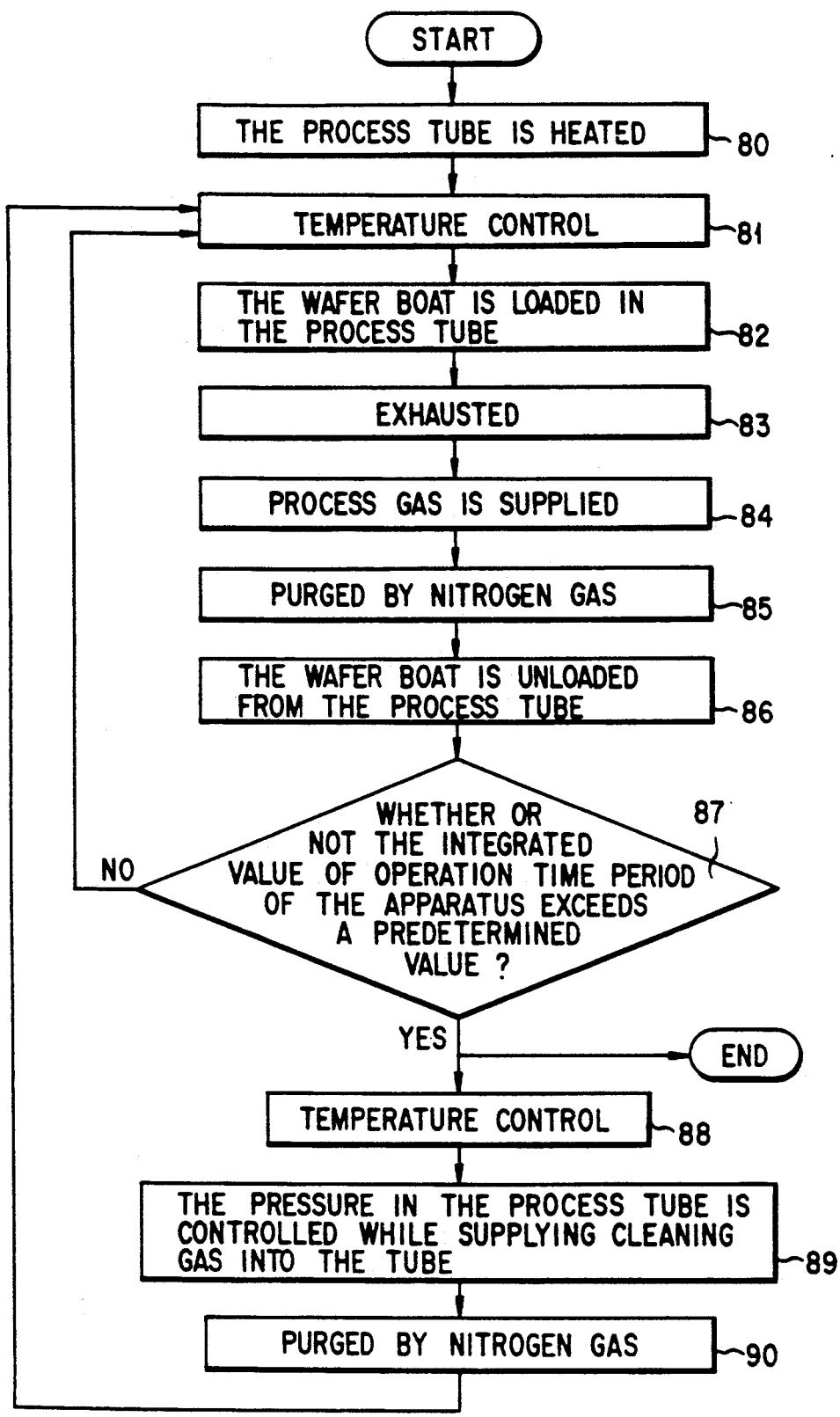
F I G. 3

METHOD OF CLEANING A PROCESS TUBE WITH ClF₃ GAS AND CONTROLLING THE TEMPERATURE OF PROCESS

This application is a continuation of application Ser. No. 07/818,677, filed on Jan. 9, 1992, now abandoned.

BACKGROUND OF THE INVENTION

1. Field of the Invention

The present invention relates to a method of cleaning a process tube and a wafer boat and more particularly, it relates to a process tube cleaning method capable of more efficiently removing film of the silicon oxide group to make the cleaning rate as higher as possible.

2. Description of the Related Art

Generally, film such as group of the polysilicon (Poly-Si), silicon nitride (SiN) and silicon oxide ($SiO_2$) is formed on each of semiconductor wafers in the course of manufacturing semiconductor devices, using the pressure-reduced or normal pressure CVD apparatus.

In the course of forming film of the $SiO_2$ group on each of the semiconductor wafers, for example, the wafer boat is loaded in the process tube of the pressure-reduced CVD apparatus and heated under reduced pressure. $SiH_4$ and $O_2$ gases are then introduced into the process tube to form $SiO_2$ film on each of the silicon wafers. When the wafer boat is loaded and unloaded, the temperature in the process tube is kept substantially same as that in the process tube in which the film forming process is being carried out. When the film forming process is conducted, $SiO_2$ film adheres to the inner wall of the process tube and quartz-made tools in the tube. When the layer of $SiO_2$ adhering to the inner wall of the process tube develops as the film forming process is repeated, it peels off the inner wall of the process tube, scattering its particles in the process tube. These particles adhere to the wafers and contaminate them, thereby lowering the productivity of wafers. In the conventional case, therefore, the temperature in the process tube is lowered to room temperature at a certain interval and the process tube is then detached from the apparatus along with the quartz-made tools. The adhering $SiO_2$ film is thus removed from the process tube and the tools by wet washing.

When the wet washing is employed, however, it takes a long time to lower and raise the temperature in the process tube and to detach the process tube from the apparatus. The time period during which the apparatus is left inoperative becomes longer accordingly, thereby remarkably lowering the operation rate of the apparatus.

The process tube and the boat loading section of the CVD apparatus must be kept under reduced pressure. A new CVD apparatus having a load lock system for keeping the process tube and the loading section under this state has been therefore discussed these days of its practical use. When the CVD apparatus is provided with this load lock system, however, it will become difficult that the process tube which must be cleaned is detached from the apparatus itself.

Further, when the size of each wafer to be processed changes from 6 inches to 8 inches in the near future, the process tube will become larger in size and it will become more difficult to detach the process tube from the apparatus itself.

Japanese Patent Disclosures Sho 64-17857 and Hei 1-92385 disclose a method of removing reacted products from the inner wall of the process tube by the so-called dry etching. According to this method, etching gas is introduced into the process tube and plasma is generated in it after the wafer boat is unloaded from the process tube. $CF_4$, $NF_3$ or $SF_6$ gas is used as the etching gas.

When $ClF_3$ is used as the cleaning gas, film of the polysilicon system and silicon nitride system can be removed relatively clear. It has been believed, however, that this $ClF_3$ gas is not useful to remove film of the $SiO_2$ system. Therefore, $NF_3$ is used instead of the $ClF_3$ gas to remove film of the silicon oxide system from the inner wall of the process tube.

However, the $NF_3$ gas cannot be used at high temperature because its reactivity is high. When the film of the silicon oxide system laid on the inner wall of the process tube by the film forming process which has been conducted at a high temperature of about 700° C. is to be removed by the $NF_3$ gas, therefore, the apparatus must be once cooled to a temperature lower than that (or process temperature) at which the film forming process has been carried out.

It takes a long time to cool the apparatus from the process temperature to the cleaning temperature and heat it from the cleaning temperature to the process temperature. Further, it also takes a long time to finish the cleaning process because etching rate becomes low at low temperature. As the result, the apparatus must be left inoperative for more than 24 hours until the cleaning process is finished, thereby lowering the operation rate of the apparatus to a great extent.

SUMMARY OF THE INVENTION

The object of the present invention is therefore to provide a method of cleaning the process tube, said method being capable of shortening the time needed to finish the cleaning process and increasing the operation rate of the CVD apparatus.

$ClF_3$ gas was conventionally deemed as being unsuitable for use as the cleaning gas to remove film of the silicon oxide group. However, the present invention has been made on such a finding that the film of the $SiO_2$ group can be more effectively etched by the $ClF_3$ gas when this gas is used at relatively high temperature.

According to an aspect of the present invention, there can be provided a method of cleaning a process tube, whereby film of a silicon oxide system adhering to an inner wall of the process tube and support members for supporting objects to be processed when these objects are being processed in the process tube can be removed, said tube cleaning method comprising carrying the objects out of the process tube; controlling the temperature in the process tube same as or lower than process temperature and higher than the boiling point of $ClF_3$, said process temperature being kept in the process tube when the process of forming film on the objects is carried out in the process tube; supplying $ClF_3$-contained cleaning gas into the process tube to react this cleaning gas with the film of the silicon oxide system adhering to the inner wall of the process tube and the support members for the objects to be processed.

According to a process tube cleaning method of the present invention, the temperature in the process tube can be left relatively high or about 630° C., for example, which is substantially same as that needed to form film of the $SiO_2$ system on each of silicon wafers. Cleaning gas in which ClF$_3$ gas is diluted to an appropriate concentration of 20%, for example, by inactive gas such as nitrogen gas is introduced into the process tube. It is preferable in this case that the cleaning gas contains the ClF$_3$ gas of 20±5 volume % in it.

The film of the SiO$_2$ system laid in the process tube can be efficiently etched by the cleaning gas thus supplied. Particularly, the temperature at which the film of the SiO$_2$ system is formed on each of the semiconductor wafers is substantially same as or quite little different from that needed to carry out the cleaning process. Therefore, it is not necessary to lower the temperature in the process tube when the cleaning process is to be carried out. In addition, both of the film forming and cleaning processes can be continued without any loss of time. The time during which the apparatus is left inoperative because of the cleaning process carried out can be shortened to minimum.

In order to uniformly diffuse the etching gas in the process tube so as to uniformly etch film and other products laid in the process tube, it is advantageous to make the pressure in the process tube as low as possible. On the other hand, it is also advantageous to make it so high as possible that components of the etching gas can be contained in the process tube at as large an amount as possible, in order to increase the etching rate. From this reason, it is preferable to set it in a range of 1-5 Torr, paying attention to both of these etching uniformity and rate. When the etching uniformity is deemed as being more important, however, it is preferable to set it lower than 1 Torr.

It is also preferable to previously heat the cleaning gas to a temperature higher than the boiling point of ClF$_3$, before it is supplied into the process tube.

In order to obtain a desired etching rate, it is preferable that the temperature in the process tube in which the cleaning process is being carried out is made higher than 400° C.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a view schematically showing the heat-treating apparatus of the vertical type to which the cleaning method according to an embodiment of the present invention can be applied;

FIG. 3 is a flow chart intended to explain film forming and cleaning processes;

DETAILED DESCRIPTION OF THE PREFERRED EMBODIMENTS

Figure 2:
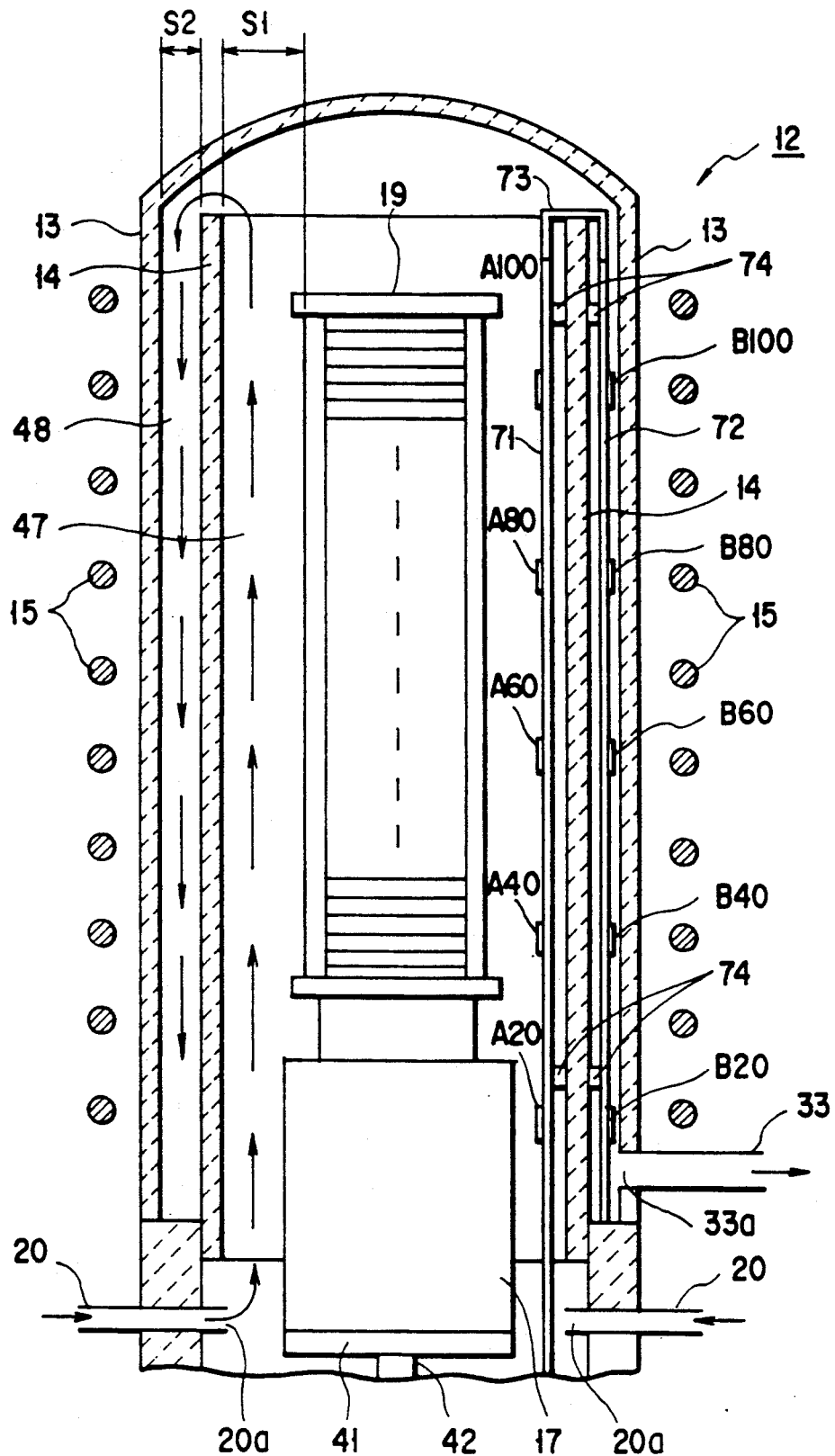
FIG. 2 is a vertically-sectioned view showing the process tube in the heat-treating apparatus of the vertical type.

A case where the present invention is applied to the CVD apparatus of the vertical batch type will be described with reference to the accompanying drawings.

As shown in FIG. 1, a CVD apparatus 10 of the vertical type has a process tube 12 including an outer cylinder 13 made of quartz and an inner cylinder 14 also made of quartz and arranged concentric with the inner cylinder 13 with a certain interval interposed between them. The process tube 12 has a heat insulator (not shown) round its outer cylinder 13 and it was further enclosed by heaters 15.

A disk-like cap 45 is fitted into the open bottom of the process tube 12 to air-tightly close the tube 12. Magnetic fluid seal (not shown) is used to freely rotatably and air-tightly pass a rotary shaft 46 through the cap 45. The rotary shaft 46 has a support plate 41 at the upper end thereof and it is connected to the drive shaft of a motor 43 at the lower end thereof.

An insulating cylinder 17 is mounted on the support plate 41 and a wafer boat 19 made of quartz is then mounted on the insulating cylinder 17. A plurality of silicon wafers W are housed in the wafer boat 19 at a certain pitch interval.

A plate 51 of a lift system 50 is connected to a center member 44 of the cap 45. A screw 52 is screwed into a nut of the plate 51. The lower end of the screw 52 is connected to the drive shaft of a motor 53 and when the screw 52 is rotated by the motor 53, the wafer boat 19, the insulating cylinder 17 and the cap 45 are moved, as a unit, up and down.

Plural gas pipes 20 are attached to a lower manifold 18 of the process tube 12. A gas inlet 20a of each gas pipe 20 is opened inside the inner cylinder 14 of the process tube 12. Each gas pipe 20 is communicated with a reaction gas supply system 21 and also with a cleaning gas supply system 22 by a branch pipe. The branched pipe of the reaction gas supply system 21 has a changeover valve 23 and the other branched pipe of the cleaning gas supply system 22 also has a changeover valve 24.

The cleaning gas supply system 22 has ClF$_3$ and N$_2$ gas supply sources 25 and 26. N$_2$ is used as carrier and dilution gas and ClF$_3$ as etching gas.

A pipe line 31 extending to the ClF$_3$ gas supply source 25 has a mass flow controller 27 and valves 29 located up- and down-stream the mass flow controller 27. Another pipe line extending to the N$_2$ gas supply source 26 also has a mass flow controller 28 and valves 30 located up- and down-stream the mass flow controller 28.

Amounts of ClF$_3$ and N$_2$ gases supplied are adjusted by the mass flow controllers 27 and 28, so that they can be mixed to dilute ClF$_3$ gas. Mixed gas having a predetermined concentration of ClF$_3$ gas thus diluted is supplied from the cleaning gas supply system 22 to each gas pipe 20.

The pipe line 31 of the ClF$_3$ gas supply source 22 is wrapped by a tape heater 32. This tape heater 32 has a heating power source (not shown) to heat ClF$_3$ gas in the pipe line 31. When heated by the tape heater 32, ClF$_3$ gas having a a boiling point of 11.75° C. can be prevented from becoming re-liquefied in the pipe line 31. This is intended to prevent the pipe line from being rusted.

An inlet 33a of an exhaust pipe 33 is communicated with a space 48 between the outer 13 and the inner cylinder 14 at the lower portion of the process tube 12. The exhaust pipe 33 is connected to the sucking side of a vacuum pump 34 at the other end thereof and gases introduced into the process tube 12 is exhausted outside through the exhaust pipe 33. The vacuum pump 34 is preferably of the oil-free and dry type. This is because ClF$_3$ is used as the cleaning gas. When the wet pump is used, pump oil is deteriorated by ClF$_3$ and the pump itself is damaged by chlorine and fluorine mixed in pump oil.

The exhaust pipe extending from the pump 34 has a remover means 35, which serves to remove harmful and dangerous gas components from ClF$_3$-contained gas exhausted. The remover means 35 houses a cylinder 36 therein and this cylinder 36 contains chemicals for absorbing or dissolving the harmful and dangerous gas components.

The film forming and cleaning processes of silicon oxide which are carried out in the CVD apparatus of the vertical type will be described with reference to FIG. 3.

The film forming process of silicon oxide will be described at first.

Gases in the process tube 12 are purged by nitrogen gas. The process tube 12 is then heated by the heater 15 (Step 80). The amount of current supplied to the heater 15 is controlled by a controller (not shown) which is backed up by the computer system. The process tube 12 is thus heated to a predetermined film processing temperature (Step 81). This film process temperature is needed to be suitable for processing SiO$_2$ film on the silicon wafers and it is therefore set to be in a range of 600°–850° C., depending upon the film processing requisites such as film thickness.

The wafer boat 19 is loaded in the process tube 12 (Step 82). A plurality of silicon wafers W each having a diameter of 8 inches are housed in the wafer boat 19. When the wafer boat 19 is loaded in the process tube 12, the open bottom of the process tube 12 is air-tightly closed by the cap 45.

The process tube 12 is then exhausted to reduce its internal pressure to about $1 \times 10^{-3}$ Torr (Step 83).

The valve 23 is opened to introduce SiH$_4$, O$_2$ and Si(OC$_2$H$_5$)$_4$ gases from the process gas supply system 21 into the process tube 12 through the gas pipe 10 (Step 84). The process tube 12 is kept to have a vacuum of about 1.0 Torr while controlling the amount of these gases introduced and exhausting the process tube 12. Film is formed on the silicon wafers W under this state. The changeover valve 24 on the pipe line extending to the cleaning gas supply system 22 is closed for this while.

After the film forming process is finished in this manner, nitrogen gas is supplied to the process tube 12 to exhaust it. The process tube 12 is thus filled with innocent atmosphere and kept normal in pressure (Step 85). Hydrogen gas purge may be used instead of the nitrogen gas purge in this case.

The wafer boat 19 is unloaded from the process tube 12 (Step 86). The temperature in the process tube 12 is kept same as the film process temperature.

The wafer boat 19 unloaded is carried from the heater sleeve 17 to another intended place or silicon wafers W are carried from the wafer boat 19 to a wafer-carrier (not shown). A plurality of new silicon wafers W which are to be film-processed are housed in the wafer boat 19.

Various kinds of data obtained from the CVD apparatus 10 are supplied to the computer system and the time period during which the apparatus 10 must be kept operating is integrated from the data thus supplied. It is found by the computer system whether or not the integrated value of this apparatus-operating time period exceeds a previously-set value (Step 87). This may be carried out, using the times at which the apparatus 10 is used, instead of this integrated value of the apparatus-operating time period.

When it is found NO by the computer system, command signal is sent from the computer system to the controller (not shown) to control the temperature of the process tube 12 (Step 81). The steps 82–86 are then repeated and film is thus formed on the new silicon wafers W.

Cleaning steps 88–90 will be now described.

When it is found YES by the computer system, the wafer boat 19 in which no wafer is housed is loaded in the process tube 12. The open bottom of the process tube 12 is then air-tightly closed by the cap 45. The process tube 12 is controlled in such a way that the temperature in it is kept same as the film processing temperature or about 620° C., for example, a little lower than the film processing temperature (Step 88).

The changeover valve 24 is opened to supply cleaning gas from the cleaning gas supply system 22 into the process tube 12 through the gas pipe 10. While controlling the vacuum pump 34, the process tube 12 is exhausted to have an internal pressure within a range of 1–5 Torr. From the viewpoint of regarding the etching uniformity in the process tube 12 as being more important, it is preferable in this case that the internal pressure in the process tube 12 is made as low as possible. On the contrary from the viewpoint of increasing etching rates, it is preferable that the internal pressure is made so high as possible that components of the etching gas can be contained in the process tube 12 at as large an amount as possible.

During the cleaning operation, amounts of ClF$_3$ and N$_2$ gases supplied are adjusted by the mass flow controllers 27 and 28 in such a way that the concentration of ClF$_3$ occupies about 20% in the cleaning gas (Step 89).

When this step 89 is kept for a time period sufficiently longer than that calculated the etching rate intended, silicon oxide film adhering to the inner face of the process tube 12 and also to the wafer boat 19 can be removed.

The supply of the cleaning gas is stopped and nitrogen gas is supplied to fill the process tube 12 with this nitrogen gas (Step 90). The film processing steps 81–87 are then repeated. Even when the answer at the step 87 is found YES by the computer system, the apparatus 10 can be immediately stopped without advancing to the cleaning steps 88–90. This allows the apparatus 10 to be fully checked and repaired.

The rates of etching various kinds of film were examined using product and sample wafers. Results thus obtained will be described with reference to FIGS. 2 through 7.

Figure 4:
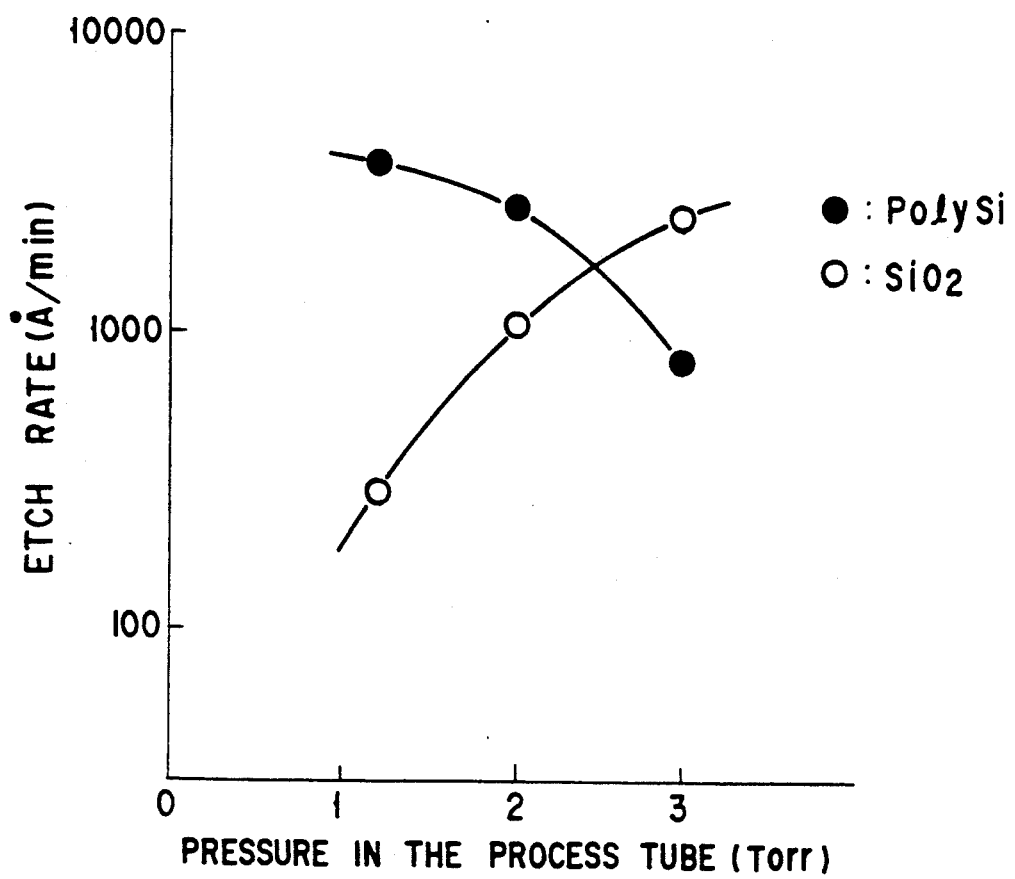
FIG. 4 is a graph showing how etching rates of polysilicon and silicon oxide adhering to the inner face of the process tube depend upon pressure.

FIG. 4 is a graph showing the relation of the internal pressure in the process tube to the etching rates of polysilicon and silicon oxide. In FIG. 4, the internal pressure in the process tube is plotted on the horizontal axis and the rates of etching polysilicon and silicon oxide on the vertical axis. As apparent from FIG. 4, the rate of etching polysilicon is lowered but the rate of etching silicon oxide is increased as the internal pressure in the process tube is increased from 1 Torr to 3 Torr.

As shown in FIG. 2, five samples A20, A40, A60, A80 and A100 were arranged in a space 47 between the inner cylinder 14 and the wafer boat 19 in order to measure etching rates. Five other samples B20, B40, B60, B80 and B100 were also arranged in a space 48 between the outer 13 and the inner cylinder 14. The space 47 has a width $S_1$ of 35 mm and the space 48 a width $S_2$ of 40 mm.

Figure 5:
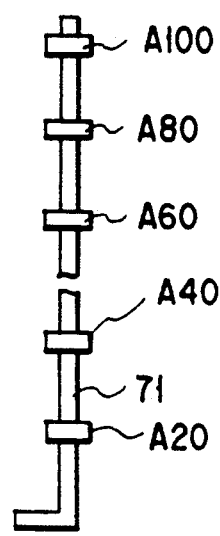
FIG. 5 is a view showing a quartz rod to which plural samples are attached to check the adhering of polysilicon and silicon oxide.

As shown in FIG. 5, samples A20-A100 are attached, at an interval of 20 cm, to the quartz-made rod 71 which is bent at the lower portion thereof. Silicon oxide film is formed on each of samples A20-A100. Similarly, samples B20-B100 are attached, at an interval of 20 cm, to the quartz-made rod 72. Each of the samples A20 and B20 is separated from the bottom of the process tube 12 by 20 cm.

As shown in FIG. 2, spacers 74 are sandwiched between the rod 71 and the inner cylinder 14 and also between the rod 72 and the inner cylinder 14. These spacers 74 keep samples A20-A100 and B20-B100 separated from the inner cylinder 14 by 10 mm. Tops of the rods 71 and 72 are connected to each other by a coupling member 73 not to fall from their original positions.

Figure 6:
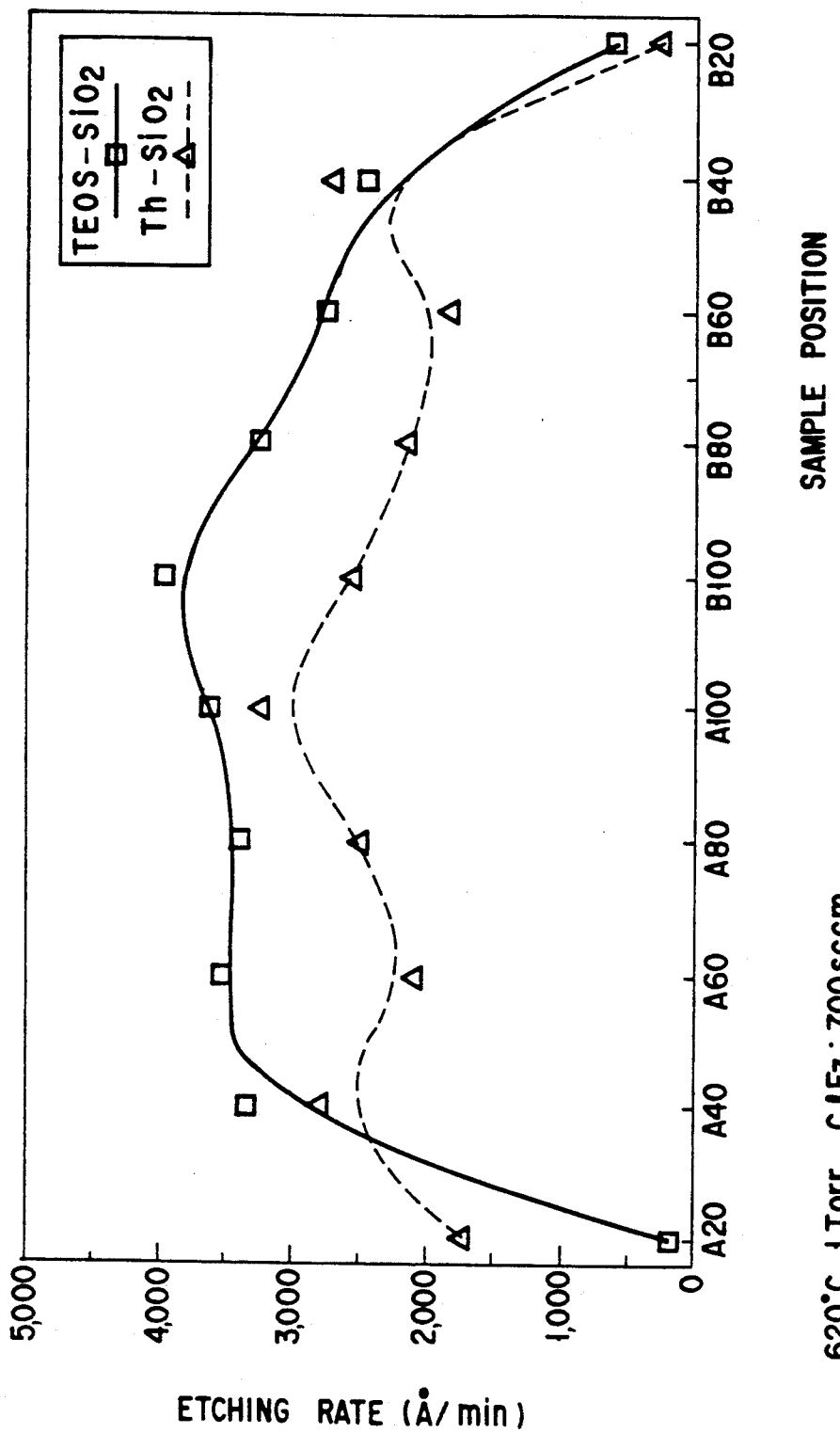
FIG. 6 is a graph showing how silicon oxide adhering to the inner face of the process tube is cleaned by ClF$_3$.

FIG. 6 is a graph showing how the rate of etching silicon oxide film change according to the position of each sample in the process tube. In FIG. 6, the position of each sample is plotted on the horizontal axis and the etching rate of silicon oxide on the vertical axis. The conditions under which the cleaning steps were carried out were as follows. The temperature in the process tube 12 was about 620° C. and the pressure in it was about 1.0 Torr. ClF$_3$ gas of 700 SCCM was mixed with N$_2$ gas of 800 SCCM to prepare the cleaning gas having a ClF$_3$ concentration of about 20%. The cleaning time was one minute. As film samples of silicon oxide group, film of Th—SiO$_2$ was prepared by heat-oxidizing process, and Si(OC$_2$H$_5$)$_4$ was used to prepare film of TEOS—SiO$_2$ according to CVD.

In FIG. 6, triangles represent rates of etching Th—SiO$_2$ film on the samples and rectangles denote rates of etching TEOS—SiO$_2$ film on the samples.

As apparent from FIG. 6, the etching rates are in a range of 2000-4000 angstrom/min and the etching rates particularly relative to TEOS—SiO$_2$ film are in a range of 3000-4000 angstrom/min, except for the cases of the samples A20 and B20 each being separated from the bottom of the process tube 12 by 20 cm. This value of 3000-4000 angstrom/min is far larger than that of the etching rates obtained in the conventional case where NF$_3$ gas was used. When ClF$_3$ is used as cleaning gas relative to films of silicon oxide group under the above-mentioned cleaning conditions, therefore, a more efficient cleaning process can be achieved.

Although ClF$_3$ gas has been diluted by N$_2$ gas to have its concentration of about 20% in this example, this concentration of ClF$_3$ may be changed, if necessary.

As apparent from the above, the cleaning steps can be carried out at the substantially same temperature, or about 620° C., as that in the process tube 12 in which film of SiO$_2$ group is formed on the silicon wafers W. When the film forming process is to be changed to the cleaning process, therefore, it is almost unnecessary to lower or raise the temperature in the process tube 12. This enables both of these processes to be continuously carried out, thereby increasing the operation rate of the apparatus.

Figure 7:
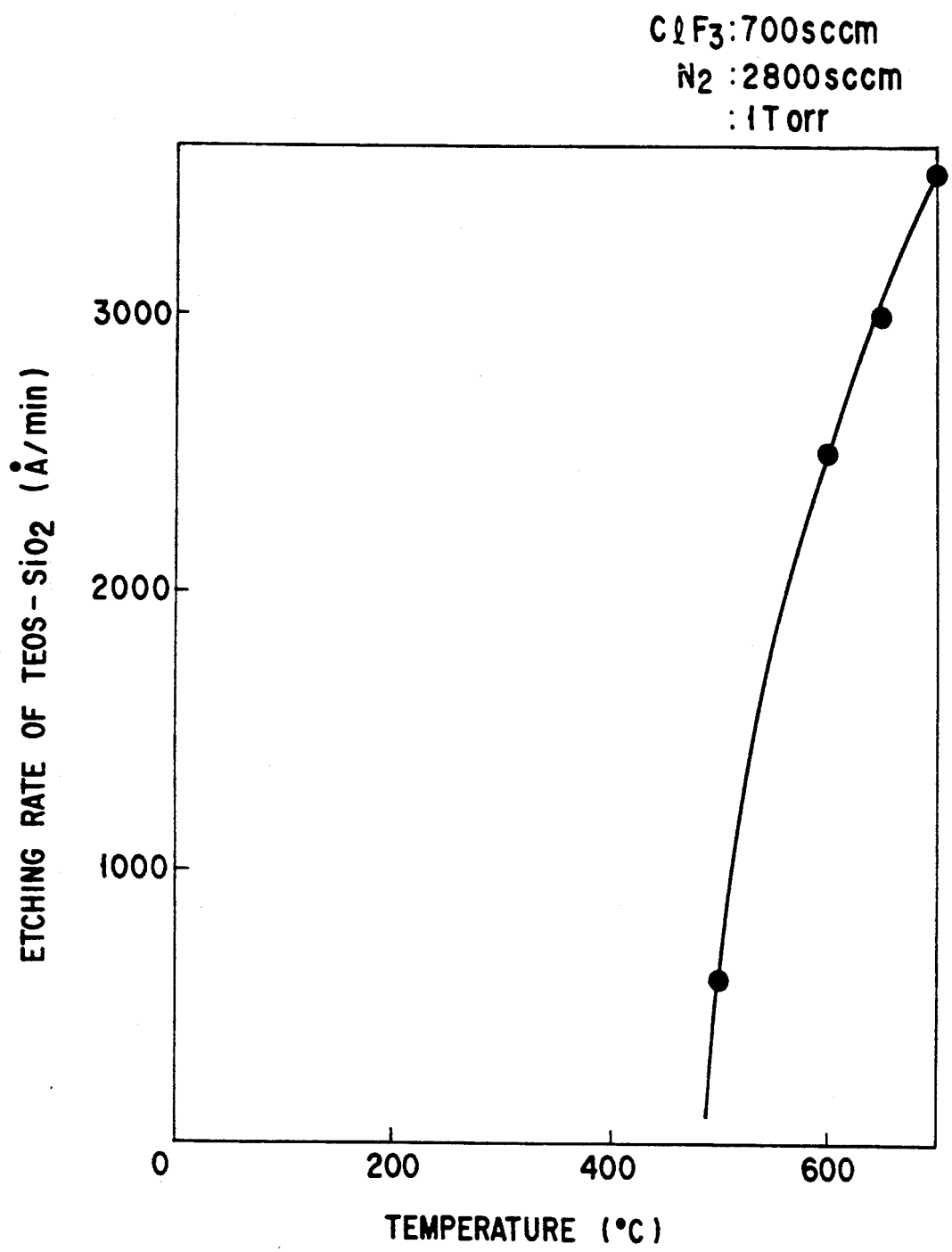
FIG. 7 is a graph showing the relation of temperature to the etching rate.

FIG. 7 is a graph showing the relation of etching rate to temperature. In FIG. 7, temperatures are plotted on the horizontal axis and etching rates relative to TEOS—SiO$_2$ film on the vertical axis. The cleaning conditions in this case were that ClF$_3$ gas of 700 SCCM and N$_2$ gas of 2800 SCCM were supplied and that the pressure in the process tube was kept 1 Torr. As apparent from FIG. 7, the etching rate is 600 angstrom/min at the temperature of 500° C. but it is too small for practical use at the temperature of 400° C. It is therefore preferable that the temperature is kept higher than 450° C.

Although the cleaning gas has been continuously supplied into the process tube in the above-described examples, it may be supplied like pulses or intermittently into the process tube. Or it may be supplied to flow in turbulence in the process tube.

Although the gas pipe 20 has been linearly inserted into the process tube 12 in the above-described examples, it may be arranged that portion of the gas pipe which is inserted into the process tube is erected upward and that a plurality of gas outlets are formed along this upward-erected portion of the gas pipe in the process tube. When the gas outlets are formed in this manner, gas can be uniformly applied to each of the silicon wafers in the process tube.

When ultrasonic wave is applied to the process tube at least during the supply of the cleaning gas into the tube, the cleaning process can be more quickly achieved. Further, when high and low ultrasonic waves are repeatedly applied to the process tube, the cleaning process can be far more quickly achieved.

Although the present invention has been used in the above examples to remove films adhering when the film forming process is carried out, it may be used to remove film of the silicon oxide group laid as results of etching and ashing processes conducted.

Although the present invention has been used in the above examples to remove film of the silicon oxide group from the inner face of the quartz-made process tube, it may be employed to remove film of the silicon oxide group from the inner face of the SiC-made process tube.

According to the present invention as described above, film of the silicon oxide group adhering to the inner face of the process tube can be etching-removed at a relatively high temperature by ClF$_3$ gas to clean the process tube. The etching rate relative to the film of the silicon oxide group can be thus made higher, as compared with the conventional rates. In addition, both of the film forming and cleaning processes can be continuously carried out without any loss of time. The cleaning process can be thus achieved for a shorter time and with a higher efficiency, thereby increasing the operation rate of the heat processing apparatus to an extent as high as possible.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of cleaning a process tube, comprising the steps of:
   loading a process tube set at a film-forming temperature with a plurality of semiconductor wafers;
   supplying a process gas into the process tube to form a silicon oxide-based film on each of said wafers;
   taking the wafers out of the process tube;
   controlling the temperature within the process tube to a temperature not higher than said film-forming temperature but higher than 450° C.;
   supplying a cleaning gas containing ClF$_3$ into the process tube to carry out reactions between the cleaning gas and a silicon oxide-based film adhered to the inner wall of the process tube so as to remove said silicon oxide-based film; and
   setting the temperature within the process tube at said film-forming temperature in preparation for the loading of the process tube with wafers which are to be processed.

2. The method according to claim 1, wherein said cleaning gas is prepared by diluting a ClF$_3$ gas with a nitrogen gas such that the cleaning gas contains 20±5% by volume of ClF$_3$.

3. The method according to claim 1, wherein the axis of said process tube extends in a vertical direction.

4. The method according to claim 1, wherein said wafers are those which have had a silicon oxide-based film formed thereon at a process temperature of 600° to 850° C.

5. The method according to claim 1, wherein said cleaning gas is supplied into the process tube maintained at 450° to 620° C.

6. The method according to claim 1, wherein said silicon oxide film comprises a silicon dioxide film.

7. The method according to claim 1, wherein said silicon oxide-based film is a SiO$_2$ film formed by using alkoxy silane, Si(OC$_2$H$_5$)$_4$.

8. The method according to claim 1, wherein the wall itself of the process tube is heated for controlling the temperature within the process tube.

9. The method according to claim 1, further comprising the steps of:
   calculating the accumulated time of the film-forming process during which the wafer stays in the process tube for formation of a silicon oxide-based film thereon; and
   determining whether the accumulated process time exceeds a reference time and, when the reference time is exceeded, supplying a cleaning gas into the process tube.

10. The method according to claim 1, further comprising the steps of:
    calculating the accumulated number of film-forming operations during which the wafer is put in and taken out of the process tube for formation of a silicon oxide-based film thereon; and
    determining whether the accumulated number of film-forming operations exceeds a reference number and, when the reference number is exceeded, supplying said cleaning gas into the process tube.

11. The method according to claim 1, consisting essentially of the steps of:
    loading a process tube set at a film-forming temperature with a plurality of semiconductor wafers;
    supplying a process gas into the process tube to form a silicon oxide-based film on each of said wafers;
    taking the wafers out of the process tube;
    controlling the temperature within the process tube to a temperature not higher than said film-forming temperature but higher than 450° C.;
    supplying a cleaning gas consisting of ClF$_3$ and nitrogen into the process tube to carry out reactions between the cleaning gas and the silicon oxide-based film adhered to the inner wall of the process tube so as to remove said silicon oxide-based film; and
    setting the temperature within the process tube at said film-forming temperature in preparation for the loading of the process tube with wafers which are to be processed.

12. A method of cleaning a process tube, comprising the steps of:
    loading a process tube set at a film-forming temperature with a plurality of semiconductor wafers together with a boat and other support members;
    supplying a process gas into the process tube to form a silicon oxide-based film on each of said wafers;
    taking the wafers together with the boat and other support members out of the process tube;
    loading the process tube with the boat and other support members alone;
    controlling the temperature within the process tube to a temperature not higher than a film-forming temperature but higher than 450° C.;
    supplying a cleaning gas containing ClF$_3$ into the process tube to carry out reactions between the cleaning gas and a silicon oxide-based film adhered to the inner wall of the process tube, boat and other support members so a to remove said silicon oxide-based film;
    taking the boat and other support members out of the process tube; and
    setting the temperature within the process tube at a film-forming temperature in preparation for the loading of the process tube with wafers which are to be processed.

13. The method according to claim 12, wherein said cleaning gas is prepared by diluting a ClF$_3$ gas with a nitrogen gas such that the cleaning gas contains 20±5% by volume of ClF$_3$.

14. The method according to claim 12, wherein the axis of said process tube extends in a vertical direction.

15. The method according to claim 12, wherein said wafers are those which have had a silicon oxide-based film formed thereon at a process temperature of 600° to 850° C.

16. The method according to claim 12, wherein said cleaning gas is supplied into the process tube maintained at 450° to 620° C.

17. The method according to claim 12, wherein said silicon oxide film comprises a silicon dioxide film.

18. A method of cleaning a process tube, comprising the steps of:
    preparing a process tube having an inner cylinder and an outer cylinder;
    taking a wafer having a film formed thereon out of the process tube;
    controlling the temperature within the process tube to a temperature not higher than a film-forming temperature but higher than 450° C.; and
    introducing a cleaning gas containing ClF$_3$ into a lower region of the inner cylinder of the process tube such that the cleaning gas flows upward along the inner wall of the inner cylinder and, then, flows downward through a clearance formed between the inner and outer cylinders so as to cause the cleaning gas to perform reactions with a silicon oxide-based film adhered to the inner and outer surfaces of the inner cylinder and the inner surface of the outer cylinder and, thus, to remove the silicon oxide-based film.

19. The method according to claim 18, further comprising the step of:

introducing a process gas into a lower region of the inner cylinder of the process tube such that the process gas flows upward within the inner cylinder and, then, flows downward through a clearance formed between the inner and outer cylinders so as to form a silicon oxide-based film on the wafer.

* * * * *